(12) United States Patent
Kim et al.

(10) Patent No.: US 7,956,464 B2
(45) Date of Patent: Jun. 7, 2011

(54) SPUTTERING TARGET AND SEMICONDUCTOR DEVICE MANUFACTURED USING THE SAME

(75) Inventors: Taek-jung Kim, Hwasung-si (KR);
Hee-sook Park, Hwaseong-si (KR);
Jong-min Back, Hwaseong-si (KR);
Su-kyoung Kim, Suwon-si (KR);
Yu-gyun Shin, Hwaseong-si (KR);
Sun-ghil Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/573,437

(22) Filed: Oct. 5, 2009

(65) Prior Publication Data
US 2010/0283154 A1    Nov. 11, 2010

(30) Foreign Application Priority Data
May 8, 2009    (KR) .................. 10-2009-0040326

(51) Int. Cl.
*H01L 23/532* (2006.01)

(52) U.S. Cl. ............. 257/751; 257/E23.157; 204/298.13
(58) Field of Classification Search ................. 257/734, 257/751, E23.157; 148/513; 204/298, 298.13; 419/38, 45
See application file for complete search history.

(56) References Cited

U.S. PATENT DOCUMENTS

| | | | | |
|---|---|---|---|---|
| 3,116,146 | A * | 12/1963 | Gatti | 419/47 |
| 6,328,927 | B1 * | 12/2001 | Lo et al. | 419/45 |
| 6,582,535 | B1 * | 6/2003 | Suzuki et al. | 148/513 |
| 7,718,117 | B2 * | 5/2010 | Watanabe et al. | 419/38 |

FOREIGN PATENT DOCUMENTS

| | | |
|---|---|---|
| JP | 2000-169923 | 6/2000 |
| JP | 2009-024198 | 2/2009 |
| KR | 10-0881716 | 1/2009 |

* cited by examiner

*Primary Examiner* — Roy K Potter
(74) *Attorney, Agent, or Firm* — F. Chau & Associates, LLC

(57) ABSTRACT

A sputtering target includes a tungsten (W)-nickel (Ni) alloy, wherein the nickel (Ni) is present in an amount of between about 0.01 weight % and about 1 weight %.

20 Claims, 6 Drawing Sheets

FIG. 8B

SPUTTERING TARGET AND SEMICONDUCTOR DEVICE MANUFACTURED USING THE SAME

CROSS-REFERENCE TO RELATED APPLICATION

This application claims priority to Korean Patent Application No. 10-2009-0040326, filed on May 8, 2009, the disclosure of which is incorporated herein in its entirety by reference.

BACKGROUND

1. Technical Field

The present disclosure relates to a sputtering target and a semiconductor device manufactured using the sputtering target, and more particularly, to a sputtering target for manufacturing an alloy thin film having low resistivity and a semiconductor device manufactured using the sputtering target.

2. Discussion of Related Art

When a line width of a gate line decreases, the resistance of the gate line increases. To reduce the resistance of a conductor line such as the gate line, the resistivity of a material forming the conductor line can be reduced.

Doped polysilicon can be used as a conductive thin film for forming the conductor line. An electrical resistance can be reduced using a polycide structure, in which a metal silicide (for example, $WSi_2$, $TiSi_2$, $TaSi_2$, or $MoSi_2$) is deposited on polysilicon, a salicide structure, in which a metal and silicon are annealed, a structure using a pure metal silicide or metal nitride, or a structure using a metal. A metal gate can be used to improve the speed of the semiconductor device.

As an integration degree increases and a design rule decreases, a thickness of the semiconductor device may increase to obtain the same or improved electrical characteristics. However, since the thickness of the semiconductor device increases, the operating speed thereof may be reduced due to interference in the semiconductor device. Accordingly, a conductive thin film for forming a conductor line having the low resistivity is needed to obtain the same or improved electrical characteristics without increasing the thickness of the semiconductor device.

SUMMARY

The inventive concept provides a sputtering target for forming a conductive thin film having low resistivity.

The inventive concept provides a semiconductor device including the conductive thin film having low resistivity.

According to an exemplary embodiment, a sputtering target comprises a tungsten (W)-nickel (Ni) alloy, wherein the nickel (Ni) is present in an amount of between about 0.01 weight % and about 1 weight %.

The sputtering target can be for forming a part of a gate pattern of a semiconductor device.

The sputtering target can be for forming a part of a bitline pattern of a semiconductor device.

The sputtering target can be for forming a part of a contact plug pattern of a semiconductor device.

The sputtering target can be for forming a part of a wiring pattern of a semiconductor device.

According to an exemplary embodiment, a semiconductor device comprises a barrier layer, a seed layer formed on the barrier layer, and a conductive layer formed on the seed layer, wherein the conductive layer comprises a thin film of a tungsten (W)-nickel (Ni) alloy, wherein the nickel (Ni) is present in an amount of between about 0.01 weight % and about 1 weight %.

The thin film can be formed by physical vapor deposition (PVD) using a sputtering target comprising an alloy of W and Ni.

A crystal structure of the thin film may comprise a columnar structure.

The bather layer may comprise at least one of titanium, titanium nitride, or a combination thereof.

The seed layer may comprise W silicide.

According to an exemplary embodiment, a semiconductor device comprises a substrate, an insulating layer disposed on the substrate intermittently, a barrier layer disposed on the insulating layer and the substrate, a seed layer disposed on the barrier layer, and a conductive layer disposed on the seed layer, wherein the conductive layer comprises a thin film of a tungsten (W)-nickel (Ni) alloy, wherein the nickel (Ni) is present in an amount of between about 0.01 weight % and about 1 weight %.

The thin film can be a part of a gate pattern.
The thin film can be a part of a bitline pattern.
The thin film can be a part of a contact plug pattern.
The thin film can be a part of a wiring pattern.
The thin film can be formed by physical vapor deposition (PVD) using a sputtering target comprising an alloy of W and Ni.

A crystal structure of the thin film may comprise a columnar structure.

The barrier layer may comprise at least one of titanium, titanium nitride, or a combination thereof.

The seed layer may comprises W silicide.

A thickness of the barrier layer can be about 100 Å and a thickness of the seed layer can be about 50 Å.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EXEMPLARY EMBODIMENTS

The inventive concept will now be described more fully with reference to the accompanying drawings in which exemplary embodiments of the inventive concept are shown. This inventive concept may, however, be embodied in many different forms and should not be construed as limited to the exemplary embodiments set forth herein.

It will be understood that when an element or layer is referred to as being "formed on," another element or layer, it can be directly or indirectly formed on the other element or layer.

Figure 1:
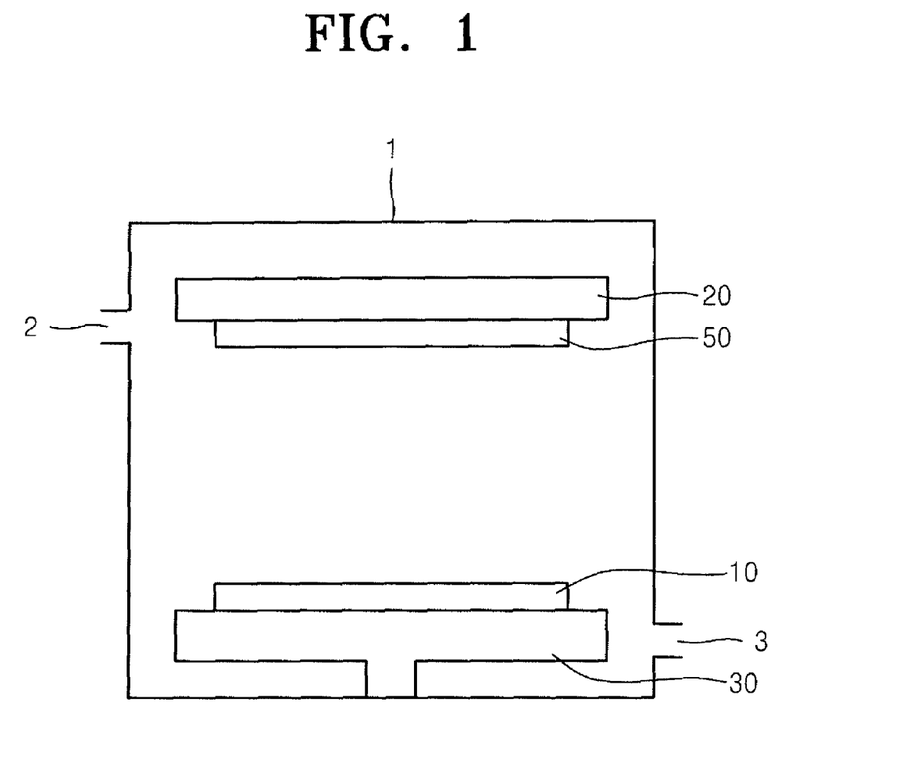
FIG. 1 is a plan view schematically illustrating forming an alloy thin film of tungsten (W) and nickel (Ni) ("a W—Ni alloy thin film") using a sputtering target according to an embodiment of the inventive concept.

FIG. 1 is a plan view schematically illustrating forming an alloy thin film of tungsten (W) and nickel (Ni) ("a W—Ni alloy thin film") using a sputtering target 50 according to an embodiment of the inventive concept.

Referring to FIG. 1, the sputtering target 50 may be formed in a sputtering device 1 for forming a W—Ni alloy thin film. The sputtering target 50 may comprise a tungsten (W)/nickel (Ni) alloy, wherein the nickel (Ni) is present in an amount of between about 0.01 weight % and about 1 weight %. The remaining elements ("remainder") include W and other impurities. The sputtering target 50 may be formed by, for example, mixing W and Ni based on weight ratio and then heat treating the mixture, or may be formed by heat treating W—Ni alloy powder at high temperatures.

The sputtering target 50 is disposed in the sputtering device 1 and a W—Ni alloy thin film may be formed on a substrate 10. For example, the sputtering device 1 may include a susceptor 30 for placing the substrate 10 in a chamber and a backing plate 20 to which the sputtering target 50 is disposed for forming the W—Ni alloy thin film on the substrate 10.

In the sputtering device 1, when a direct current (DC) voltage is applied to the susceptor 30 and the backing plate 20, and when argon gas is injected into a gas injection pipe 2 of the chamber, plasma may be formed between the susceptor 30 and the backing plate 20. Ions of the argon gas collide with the sputtering target 50 of the backing plate 20 and W and Ni are emitted from the sputtering target 50. Thus, W and Ni may attach to the substrate 10. Accordingly, the W—Ni alloy thin film may be deposited on the substrate 10. Then, remaining argon gas and residual gas may be discharged through a gas discharge pipe 3 of the chamber.

In an exemplary embodiment, the susceptor 30 may function as an anode and the backing plate 20 may function as a cathode.

Figure 2:
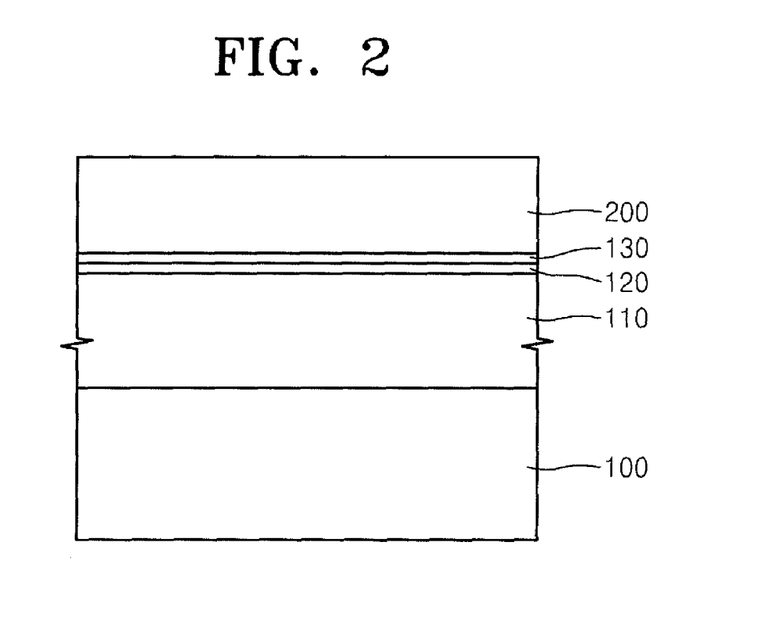
FIG. 2 is a cross sectional view of a W—Ni alloy thin film deposited on a substrate according to an embodiment of the inventive concept.

FIG. 2 is a cross sectional view of a W—Ni alloy thin film deposited on a substrate according to an embodiment of the inventive concept.

Referring to FIG. 2, an insulating layer 110 may be formed on a substrate 100. The substrate 100 may be, for example, a silicon substrate, a silicon-on-insulator (SOI) substrate, a gallium-arsenic substrate, a silicon germanium substrate, a ceramic substrate, a quartz substrate, or a glass substrate. The substrate 100 may include unit elements such as various kinds of active elements or passive elements. In an exemplary embodiment, an isolation layer for separating the unit elements may be formed in the substrate 100. For example, the isolation layer may be formed by local oxidation of silicon (LOCOS) or shallow trench isolation (STI). In an exemplary embodiment, an inter layer dielectric layer covering the unit elements may be formed in the substrate 100. In an exemplary embodiment, conductive regions electrically connected to the unit elements through the inter layer dielectric layer may be formed in the substrate 100. In an exemplary embodiment, conductor lines connecting the unit elements or the conductive regions may be formed in the substrate 100. The insulating layer 110 may comprise an oxide, a nitride, or an insulating material including an oxide and a nitride.

A barrier layer 120 and a seed layer 130 may be sequentially formed on the insulating layer 110. The barrier layer 120 may comprise titanium (Ti), Titanium nitride (TiN), or a combination thereof. The barrier layer 120 may have a thickness of, for example, about 100 Å. The seed layer 130 may be formed on the barrier layer 120. The seed layer 130 may comprise, for example, W silicide ($WSi_x$). The seed layer 130 may have a thickness of, for example, about 50 Å.

The barrier layer 120 and the seed layer 130 may be formed using, for example, plasma enhanced chemical vapor deposition (PECVD). When $WSi_x$ as the seed layer 130 is deposited, a silicon-containing gas, for example, monosilane ($SiH_4$), dichlorosilane ($SiCl_2H_2$), or W hexafluoride ($WF_6$) may be used as a source gas.

A conductive layer 200 may be directly formed on the seed layer 130. The conductive layer 200 may be a W—Ni alloy thin film in an exemplary embodiment. After $WSi_x$ is formed as the seed layer 130, the W—Ni alloy thin film is formed as the conductive layer 200 such that the deposition speed and a characteristic of the W—Ni alloy thin film are improved. The conductive layer 200 may be deposited using a sputtering method using a sputtering target. For example, physical vapor deposition (PVD) uses the sputtering target comprising a tungsten (W)/nickel (Ni) alloy, wherein the nickel (Ni) is present in an amount of between about 0.01 weight % and about 1 weight %. The remainder includes W and other impurities. Accordingly, the conductive layer 200 may be the W—Ni alloy thin film, wherein the nickel (Ni) is present in an amount of between about 0.01 weight % and about 1 weight %. The remainder includes W and other impurities. Then, heat treatment may be performed to the conductive layer 200 so that Ni atoms included in the conductive layer 200, such as the W—Ni alloy thin film, are diffused therein.

The conductive layer 200 may be formed as a conductive pattern through, for example, photolithography and etching. The conductive pattern may be, for example, a part of a gate pattern of the semiconductor device. In an exemplary embodiment, the conductive pattern may be a part of a bitline pattern of the semiconductor device. In an exemplary embodiment, the conductive pattern may be a part of a wiring pattern of the semiconductor device.

Figure 3:
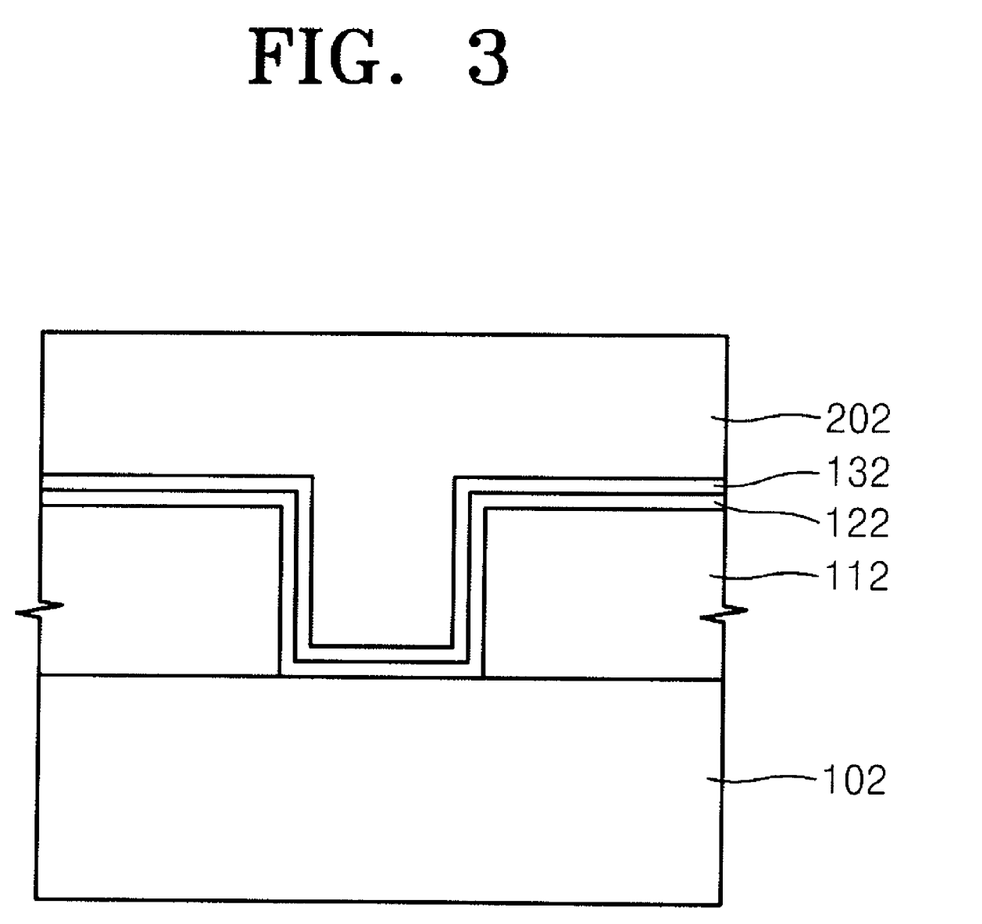
FIG. 3 is a cross sectional view of a W—Ni alloy thin film deposited on a substrate according to an embodiment of the inventive concept.

FIG. 3 is a cross sectional view of a W—Ni alloy thin film deposited on a substrate according to an embodiment of the inventive concept.

Referring to FIG. 3, an insulating layer 112 having a hole may be formed on a substrate 102. The hole in the insulating layer 112 may be formed by forming an insulating material layer to form the insulating layer 112, and then, etching the insulating material layer. The substrate 102 may be partially exposed by the hole. A barrier layer 122 and a seed layer 132 may be sequentially formed on the upper surface of the insulating layer 112, the inner surface of the hole, and the exposed surface of the substrate 102. A conductive layer 202 may be formed, for example, directly on the seed layer 132. The conductive layer 202 may be a W—Ni alloy thin film. The conductive layer 202 may be deposited by PVD using a sputtering method. A sputtering target can be used in the sputtering method. In an exemplary embodiment, the sputtering method uses the sputtering target comprising a tungsten (W)/nickel (Ni) alloy, wherein the nickel (Ni) is present in an amount of between about 0.01 weight % and about 1 weight %. The remainder includes W and other impurities. As such, the conductive layer 202 such as the W—Ni alloy thin film can be formed according to the sputtering method. Accordingly, the conductive layer 202 may be the W—Ni alloy thin film, wherein the nickel (Ni) is present in an amount of between about 0.01 weight % and about 1 weight %. The remainder includes W and other impurities.

Then, chemical mechanical polishing (CMP) or etchback is used so that a part of the conductive layer 202 remains in the hole. The part of the conductive layer 202 that remains in the hole may be a part of a contact plug pattern of the semiconductor device. The contact plug pattern fills the hole with the W—Ni alloy thin film, wherein the nickel (Ni) is present in an amount of between about 0.01 weight % and about 1 weight %. The remainder includes W and other impurities. Thus, the contact plug pattern comprising the W—Ni alloy thin film is connected to the substrate 102.

Accordingly, the W—Ni alloy thin film may be used to form various conductive wirings in the semiconductor device. For example, the W—Ni alloy thin film may be used in a part of the gate pattern, a part of the bitline pattern, a part of the wiring pattern, or a part of the contact plug pattern. In an exemplary embodiment, the W—Ni alloy thin film can be used in a via plug and other conductive patterns.

Figure 4A:
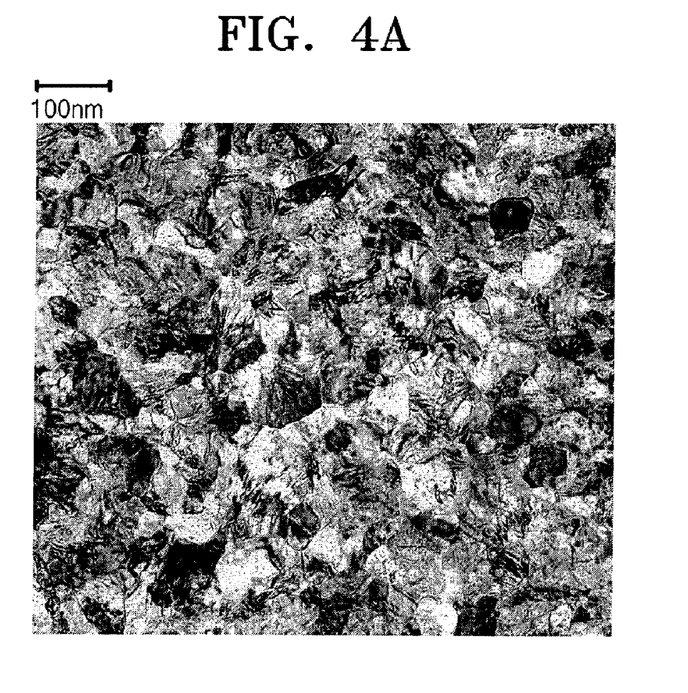
FIG. 4A is a photograph of a W thin film taken by a transmission electron microscope (TEM)
Figure 4B:
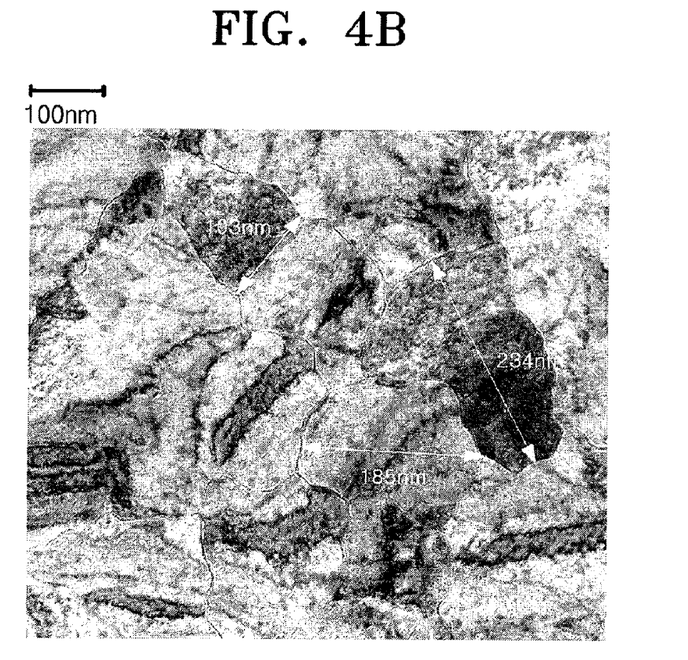
FIG. 4B is a photograph of a W—Ni alloy thin film taken by a TEM according to an embodiment of the inventive concept.

FIG. 4A is a photograph of a W thin film taken by a transmission electron microscope (TEM). FIG. 4B is a photograph of a W—Ni alloy thin film taken by a TEM according to an embodiment of the inventive concept. The W—Ni alloy thin film in FIG. 4B includes the nickel (Ni) in an amount of between about 0.01 weight % and about 1 weight %. The remainder includes W and other impurities. The W—Ni alloy thin film is heat treated.

Referring to FIGS. 4A and 4B, a grain size of the W—Ni alloy thin film is greater than that of the W thin film. The W thin film of FIG. 4A has a grain size of about 100 nm or below. However, the W—Ni alloy thin film of FIG. 4B has a grain size of average 185 nm. As such, the grain size of the W—Ni alloy thin film is generally greater than that of the W thin film. Since Ni atoms included in the W—Ni alloy thin film are diffused to a grain boundary during the heat treatment, grains of W grow. Ni atoms decrease the grain boundary energy. Thus, the grain can grow. When a grain size of W increases, the resistivity of W may be decreased. Accordingly, the resistivity of the W—Ni alloy thin film may be lower than that of the W thin film due to the Ni atoms. In an exemplary embodiment, to generate the grain growth by the Ni atoms, the W—Ni alloy thin film may include Ni in an amount of greater than about 0.01 weight %. However, when there are excessive Ni atoms, the Ni atoms may function as scattering impurities. Therefore, the W—Ni alloy thin film including Ni, in an amount of between about 0.01 weight % and about 1 weight %. As such, according to an exemplary embodiment, the W—Ni alloy thin film has a grain size greater than that of the W thin film. Thus, the resistivity of W—Ni alloy thin film is reduced such that the resistivity of W—Ni alloy thin film is smaller than that of the W thin film.

Figure 5:
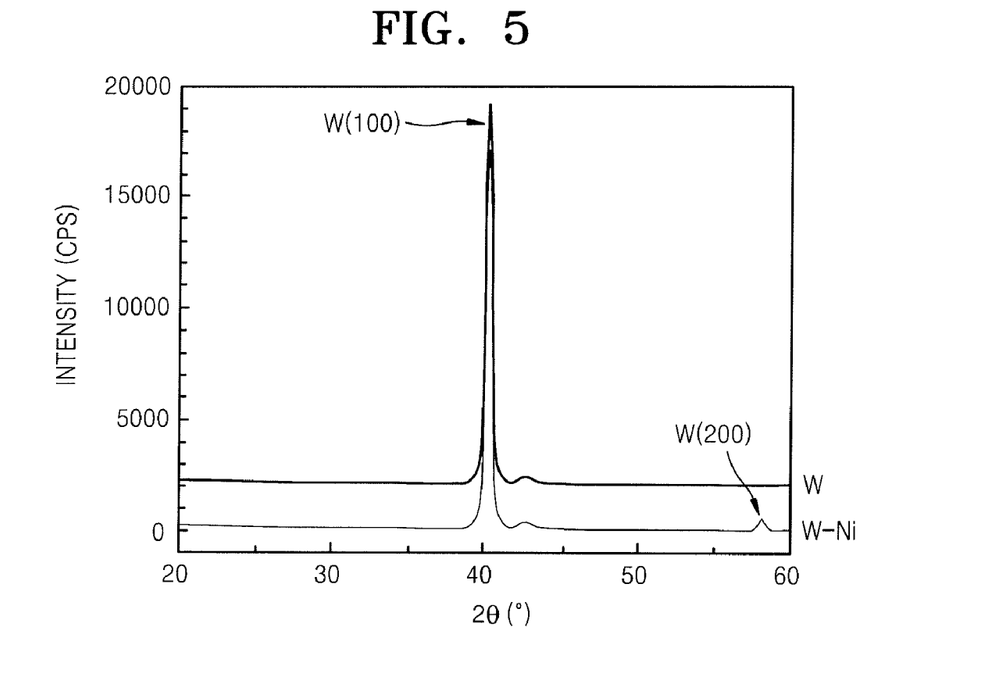
FIG. 5 is a graph showing an X-Ray diffractometer (XRD) result of a W thin film and a W—Ni thin film.

FIG. 5 is a graph showing an X-Ray diffractometer (XRD) result of the W thin film and the W—Ni thin film.

Referring to FIG. 5, according to the XRD result, a W(100) peak is shown in the XRD result W of the W thin film, and both W(100) peak and W(200) peak are shown in the XRD result W—Ni of the W—Ni alloy thin film. That is, both W(100) and W(200) peaks exist in the W—Ni alloy thin film.

Figure 6:
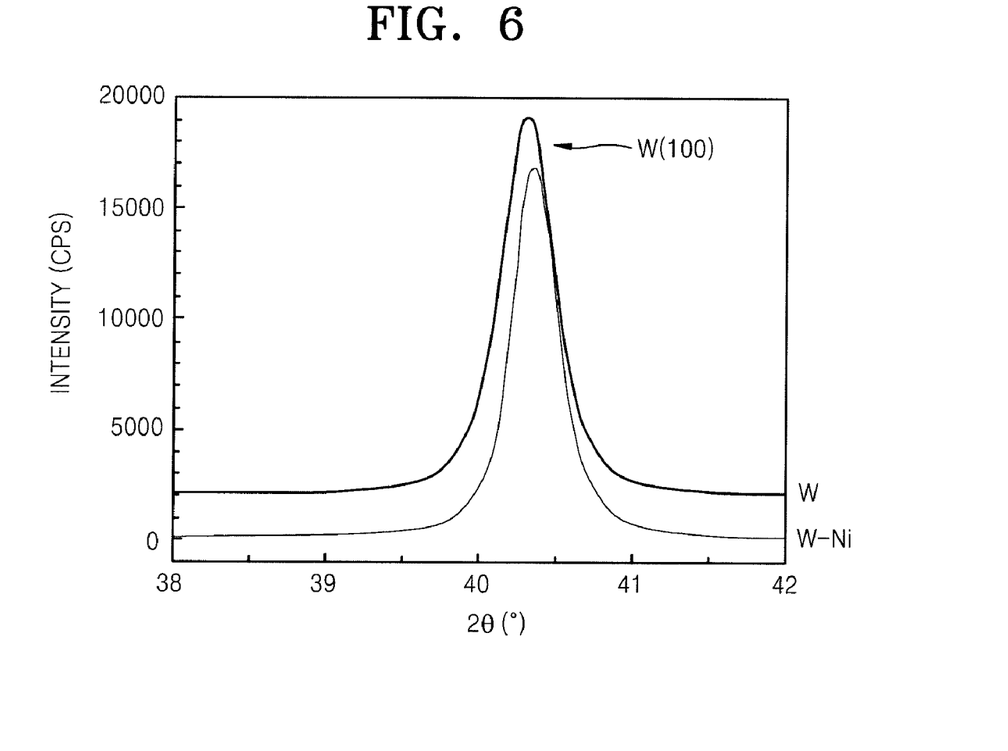
FIG. 6 is an enlarged view of the W(100) peak shown in FIG. 5.

FIG. 6 is an enlarged view of the W(100) peak shown in FIG. 5.

Referring to FIG. 6, full width at half maximum (FWHM) of the W(100) peak in the XRD result W—Ni of the W—Ni alloy thin film is smaller than that of the XRD result W of the W thin film. A reduction of FWHM of a peak indicates an increase of a grain size. Thus, the grain growth is generated in the W—Ni alloy thin film, instead of the W thin film.

Figure 7A:
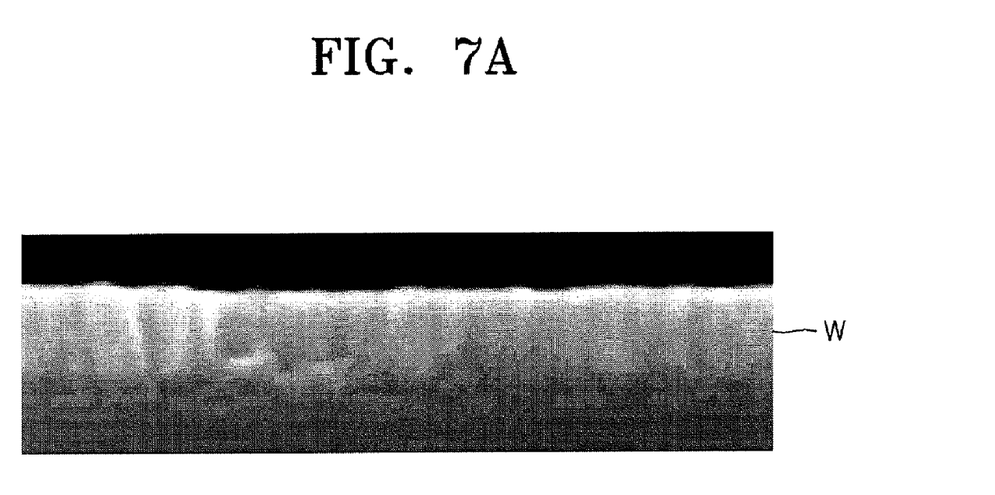
FIG. 7A is a photograph of a cross section of a W thin film taken by a scanning electron microscope (SEM)
Figure 7B:
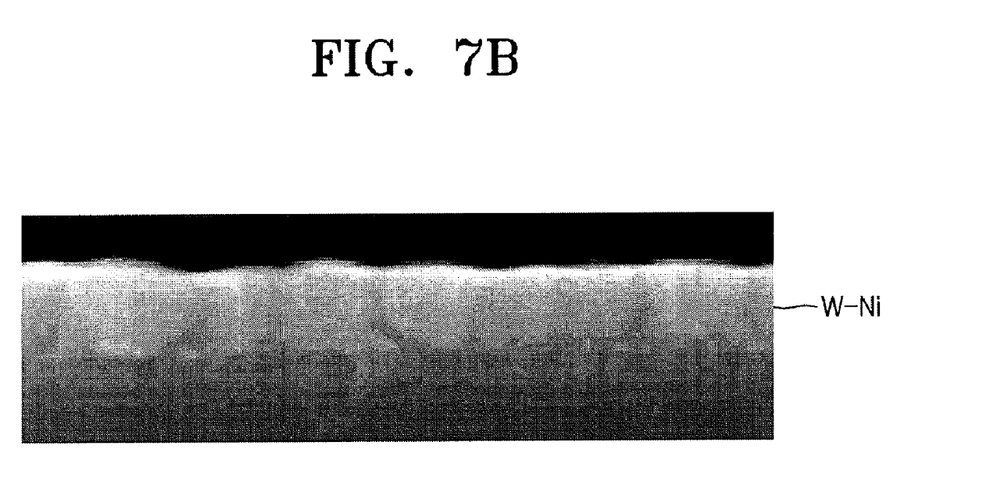
FIG. 7B is a photograph of a cross section of a W—Ni alloy thin film taken by a SEM according to an embodiment of the inventive concept.

FIG. 7A is a photograph of a cross section of a W thin film taken by a scanning electron microscope (SEM). FIG. 7B is a photograph of a cross section of a W—Ni alloy thin film taken by a SEM according to an embodiment of the inventive concept.

Referring to FIGS. 7A and 7B, a grain size is small and a complete columnar structure is not shown in the SEM photograph W of the W thin film. However, a grain size is large and a complete columnar structure, that is, a pillar structure, is shown in the SEM photograph W—Ni of the W—Ni alloy thin film. Accordingly, the W—Ni alloy thin film having a thickness appropriate for the semiconductor device may be formed with one grain in a vertical direction with respect to the upper surface of the substrate, and the resistivity of the W—Ni alloy thin film may decrease.

Figure 8A:
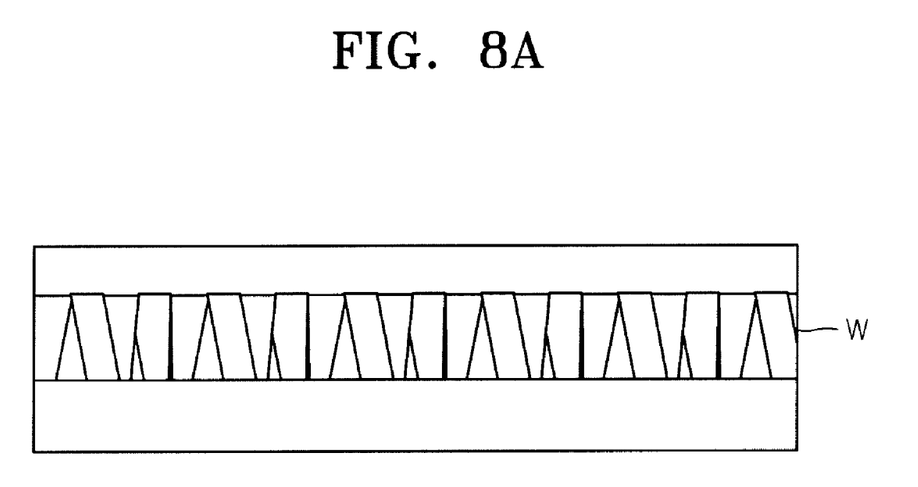
FIG. 8A is a cross sectional view illustrating grains of a W thin film.
Figure 8B:
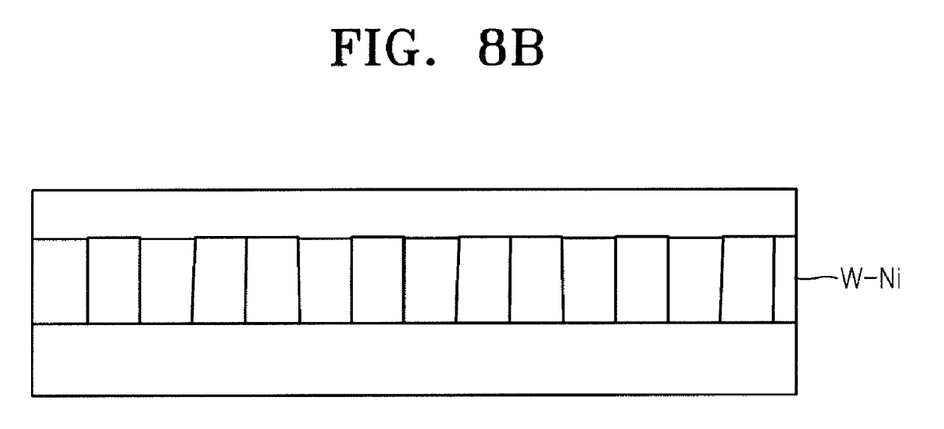
FIG. 8B is a cross sectional view illustrating grains of a W—Ni alloy thin film according to an embodiment of the inventive concept.

FIG. 8A is a cross sectional view illustrating grains of a W thin film. FIG. 8B is a cross sectional view illustrating grains of a W—Ni alloy thin film according to an embodiment of the inventive concept.

Referring to FIGS. 5A and 8B, a grain size in the cross section W of the W thin film is small and a complete columnar structure is not shown. Thus, the W thin film has high resistivity. A grain size in the cross section W—Ni of the W—Ni alloy thin film is large and a complete columnar structure is shown. In an exemplary embodiment, to minimize the effects of impurities that disperse charge transfer due to the Ni atoms, the amount of Ni atoms is between about 0.01 weight % and about 1 weight %. As such, the W—Ni alloy thin film may have low resistivity as compared to, for example, the W thin film.

Although the exemplary embodiments of the present inventive concept have been described herein with reference to the accompanying drawings, it is to be understood that the present inventive concept should not be limited to those precise embodiments and that various other changes and modifications may be affected therein by one of ordinary skill in the related art without departing from the scope or spirit of the inventive concept. All such changes and modifications are intended to be included within the scope of the inventive concept as defined by the appended claims.

What is claimed is:

1. A sputtering target comprising a tungsten (W)-nickel (Ni) alloy, wherein the nickel (Ni) is present in an amount of between about 0.01 weight % and about 1 weight %, wherein the sputtering target is used to form a conductive layer of a semiconductor device, the conductive layer is formed on a seed layer, and the seed layer is formed on a barrier layer.

2. The sputtering target of claim 1, wherein the sputtering target is for forming a part of a gate pattern of the semiconductor device.

3. The sputtering target of claim 1, wherein the sputtering target is for forming a part of a bitline pattern of the semiconductor device.

4. The sputtering target of claim 1, wherein the sputtering target is for forming a part of a contact plug pattern of the semiconductor device.

5. The sputtering target of claim 1, wherein the sputtering target is for forming a part of a wiring pattern of the semiconductor device.

6. A semiconductor device comprising:
a barrier layer;

a seed layer formed on the barrier layer; and a conductive layer formed on the seed layer, wherein the conductive layer comprises a thin film of a tungsten (W)-nickel (Ni) alloy, wherein the nickel (Ni) is present in an amount of between about 0.01 weight % and about 1 weight %.

7. The semiconductor device of claim 6, wherein the thin film is formed by physical vapor deposition (PVD) using a sputtering target comprising an alloy of W and Ni.

8. The semiconductor device of claim 6, wherein a crystal structure of the thin film comprises a columnar structure.

9. The semiconductor device of claim 6, wherein the barrier layer comprises at least one of titanium, titanium nitride, or a combination thereof.

10. The semiconductor device of claim 6, wherein the seed layer comprises W silicide.

11. A semiconductor device comprising:

a substrate;

an insulating layer disposed on the substrate intermittently;

a barrier layer disposed on the insulating layer and the substrate;

a seed layer disposed on the barrier layer; and a conductive layer disposed on the seed layer, wherein the conductive layer comprises a thin film of a tungsten (W)-nickel (Ni) alloy, wherein the nickel (Ni) is present in an amount of between about 0.01 weight % and about 1 weight %.

12. The semiconductor device of claim 11, wherein the thin film is a part of a gate pattern.

13. The semiconductor device of claim 11, wherein the thin film is a part of a bitline pattern.

14. The semiconductor device of claim 11, wherein the thin film is a part of a contact plug pattern.

15. The semiconductor device of claim 11, wherein the thin film is a part of a wiring pattern.

16. The semiconductor device of claim 11, wherein the thin film is formed by physical vapor deposition (PVD) using a sputtering target comprising an alloy of W and Ni.

17. The semiconductor device of claim 11, wherein a crystal structure of the thin film comprises a columnar structure.

18. The semiconductor device of claim 11, wherein the barrier layer comprises at least one of titanium, titanium nitride, or a combination thereof.

19. The semiconductor device of claim 11, wherein the seed layer comprises W silicide.

20. The semiconductor device of claim 11, wherein a thickness of the barrier layer is about 100 Å and a thickness of the seed layer is about 50 Å.

\* \* \* \* \*